(12) United States Patent
Watanabe (10) Patent No.: US 8,138,001 B2
(45) Date of Patent: Mar. 20, 2012

(54) SEMICONDUCTOR LIGHT-EMITTING DEVICE AND METHOD FOR PRODUCING SEMICONDUCTOR LIGHT-EMITTING DEVICE

(75) Inventor: Takashi Watanabe, Chichibu (JP)

(73) Assignee: Showa Denko K.K., Tokyo (JP)

( * ) Notice: Subject to any disclaimer, the term of this patent is extended or adjusted under 35 U.S.C. 154(b) by 178 days.

(21) Appl. No.: 12/680,738

(22) PCT Filed: Sep. 29, 2008

(86) PCT No.: PCT/JP2008/067628
§ 371 (c)(1),
(2), (4) Date: Mar. 29, 2010

(87) PCT Pub. No.: WO2009/044698
PCT Pub. Date: Apr. 9, 2009

(65) Prior Publication Data
US 2010/0219436 A1    Sep. 2, 2010

(30) Foreign Application Priority Data
Oct. 1, 2007  (JP) ................ P2007-257234

(51) Int. Cl.
*H01L 21/00* (2006.01)
*H01L 33/00* (2010.01)
(52) U.S. Cl. ............... 438/29; 257/96; 257/E33.023; 257/E33.068
(58) Field of Classification Search ......... 257/E33.023, 257/E33.049, E33.068; 438/42, 27
See application file for complete search history.

(56) References Cited

U.S. PATENT DOCUMENTS 6,711,192 B1 * 3/2004 Chikuma et al. ........... 372/43.01
2008/0267238 A1 * 10/2008 Takeuchi et al. ......... 372/46.012

FOREIGN PATENT DOCUMENTS

| JP | 06-302857 A | 10/1994 |
|---|---|---|
| JP | 2588849 A | 5/1996 |
| JP | 2001-057441 A | 2/2001 |
| JP | 3230638 A | 9/2001 |
| JP | 2002-246640 A | 8/2002 |
| JP | 2005-252222 A | 9/2005 |
| JP | 2005-353809 A | 12/2005 |
| KR | 1020060047129 A | 5/2006 |

OTHER PUBLICATIONS

Notice of Allowance dated Jul. 13, 2011 for corresponding Korean Patent Application No. 10-2010-7008771.

* cited by examiner

*Primary Examiner* — Ha Tran T Nguyen
*Assistant Examiner* — Shaka Scarlett
(74) *Attorney, Agent, or Firm* — Sughrue Mion, PLLC (57) ABSTRACT

The present invention provides a semiconductor light-emitting device that includes a compound semiconductor layer formed by laminating a first clad layer, a light-emitting layer and a second clad layer, a plurality of first ohmic electrodes formed on the first clad layer, a plurality of second ohmic electrodes formed on the second clad layer, a transparent conductive film that is formed on the first clad layer of the compound semiconductor layer and is conductively connected to the first ohmic electrodes, a bonding electrode formed on the transparent conducting film, and a support plate that is positioned on the second clad layer side of the compound semiconductor layer and is conductively connected to the second ohmic electrodes.

10 Claims, 8 Drawing Sheets

SEMICONDUCTOR LIGHT-EMITTING DEVICE AND METHOD FOR PRODUCING SEMICONDUCTOR LIGHT-EMITTING DEVICE

TECHNICAL FIELD

The present invention relates to a semiconductor light-emitting device and a method for producing the light-emitting device.
Priority is claimed on Japanese Patent Application No. 2007-257234, filed Oct. 1, 2007, the content of which is incorporated herein by reference.

BACKGROUND ART

Conventional examples of known light-emitting diodes (abbreviation: LED) capable of emitting red, orange, yellow or yellow-green visible light include compound semiconductor LEDs provided with a light-emitting layer composed of aluminum gallium indium phosphide (composition formula $(Al_XGa_{1-X})_YIn_{1-Y}P$, wherein $0 \leq X \leq 1$ and $0 < Y \leq 1$). In this type of LED, the light-emitting portion provided with the light-emitting layer composed of $(Al_XGa_{1-X})_YIn_{1-Y}P$ (wherein $0 \leq X \leq 1$ and $0 < Y \leq 1$) is generally formed on top of a substrate material such as gallium arsenide (GaAs), which is optically opaque relative to the light emitted from the light-emitting layer, and does not have a particularly high mechanical strength.

Recently, in order to obtain visible LEDs of higher brightness and further improve the mechanical strength of the devices, techniques have been disclosed in which the substrate material that is opaque relative to the emitted light is removed from the compound semiconductor layer that includes the light-emitting layer, and then a support layer formed from a transparent material (namely, a transparent substrate) transmitting the emitted light and also having superior mechanical strength to conventional substrates is subsequently bonded to the compound semiconductor layer, and a reflective layer is provided in the vicinity of the bonding interface, thereby producing a junction type LED with improved light extraction efficiency (for example, see Patent Documents 1 to 5).

Furthermore, in those cases where the compound semiconductor layer is bonded to a metal substrate as the support layer, the metal substrate is typically used as the extraction electrode, and an ohmic electrode is formed on the metal substrate side of the compound semiconductor layer, with conduction achieved between this ohmic electrode and the metal substrate.

Conventionally, it has been assumed that the surface of the semiconductor on which the ohmic electrode is formed should preferably be a flat surface in order to ensure favorable bonding strength with the metal substrate.

[Patent Document 1]
Granted Patent Publication of Japanese Patent No. 3,230,638
[Patent Document 2]
Japanese Unexamined Patent Application, First Publication No. Hei 6-302857
[Patent Document 3]
Japanese Unexamined Patent Application, First Publication No. 2002-246640
[Patent Document 4]
Granted Patent Publication of Japanese Patent No. 2,588,849
[Patent Document 5]
Japanese Unexamined Patent Application, First Publication No. 2001-57441

DISCLOSURE OF INVENTION

Problems to be Solved by the Invention

However, because the light absorption at the interface between the ohmic electrode and the compound semiconductor layer is significant, if the ohmic electrode is provided across the entire surface of the compound semiconductor layer, then the light extraction efficiency tends to deteriorate considerably. As a result, conventionally a structure has been adopted in which the ohmic electrode is positioned on the compound semiconductor layer in an islands type arrangement. However, the presence of this ohmic electrode means that the bonding surface between the compound semiconductor layer and the metal substrate is not flat, but is rather an uneven surface, and as a result, a problem arises in that the bonding strength between the compound semiconductor layer and the metal substrate tends to weaken.

Further, if a transparent resin adhesive is used when bonding the compound semiconductor layer and the metal substrate, then the adhesion interface becomes electrically insulating, meaning an electrical current is unable to flow through the bonding interface. Another problem also arises in that the resin adhesive may undergo thermal denaturation during the heat treatment used in the device production process.

Moreover, if a solder-based metal bond is used for the above bonding, then a heat treatment is required during bonding, meaning problems such as cracking during adhesion may occur between materials having different coefficients of thermal expansion.

The present invention has been designed to address the problems outlined above, and has an object of providing a semiconductor light-emitting device that exhibits a high degree of light extraction efficiency, has a high brightness level, exhibits excellent heat dissipation performance, and also displays excellent mechanical strength.

Further, another object of the present invention is to provide a method for producing a semiconductor light-emitting device that is capable of suppressing problems caused by the difference in thermal expansion properties of the semiconductor material and the metal substrate, and offers excellent yield.

Means to Solve the Problems

In order to achieve the above objects, the present invention adopts the aspects described below.

(1) A semiconductor light-emitting device, comprising:
a compound semiconductor layer formed by laminating at least a first conductive type first clad layer formed from a group III-V compound semiconductor, a light-emitting layer formed from either a first conductive type or an opposite second conductive type group III-V compound semiconductor, and a second conductive type second clad layer formed from a group III-V compound semiconductor,
a plurality of first ohmic electrodes formed on said first clad layer,
a plurality of second ohmic electrodes formed on said second clad layer,
a transparent conductive film that is formed on said first clad layer of said compound semiconductor layer and is conductively connected to said first ohmic electrodes,
a bonding electrode formed on said transparent conductive film, and a support plate that is positioned on a side of said second clad layer of said compound semiconductor layer and is conductively connected to said second ohmic electrodes, in which said first ohmic electrodes are positioned by being dispersed across a surface of said first clad layer, a plurality of depressions are provided within a bonding surface of said second clad layer on a side of said support plate, and said second ohmic electrodes are positioned within bottom portions of said depressions, said compound semiconductor layer is provided with a current diffusion layer that coats said bonding surface of said second clad layer, surfaces of said second ohmic electrodes within said depressions, and side portions of said depressions, and said support plate is bonded to said current diffusion layer.

(2) The semiconductor light-emitting device according to (1) above, wherein a surface of said current diffusion layer that contacts said second clad layer is composed of a metal material that does not form a eutectic composition with said group III-V compound semiconductor material of said second clad layer.

(3) The semiconductor light-emitting device according to (1) or (2) above, wherein voids derived from said depressions and surrounded by said current diffusion layer and said support plate are hollow spaces.

(4) The semiconductor light-emitting device according to (3) above, wherein said voids are provided in positions projected vertically down from said first ohmic electrodes.

(5) A method for producing a semiconductor light-emitting device, said method comprising:

a compound semiconductor layer formation step of sequentially forming at least a first conductive type first clad layer formed from a group III-V compound semiconductor, a light-emitting layer formed from either a first conductive type or an opposite second conductive type group III-V compound semiconductor, and a second conductive type second clad layer formed from a group III-V compound semiconductor on top of a substrate, a depression formation step of forming a plurality of depressions in an upper surface of said second clad layer, a second ohmic electrode formation step of forming second ohmic electrodes within bottom portions of said depressions, a current diffusion layer formation step of forming a current diffusion layer that coats surfaces of said second ohmic electrodes within said depressions, side portions of said depressions, and a surface of said second clad layer in a region outside of said depressions, a support plate bonding step of bonding said current diffusion layer to a support plate having a bonding surface for bonding to said current diffusion layer that is coated with an identical material to a material of said current diffusion layer, so that voids are left within said depressions, a substrate removal step of removing said substrate, a first ohmic electrode formation step of forming first ohmic electrodes in a dispersed arrangement across an upper surface of said first clad layer, and a bonding electrode formation step of coating a region surrounding said first ohmic electrodes with a transparent conductive film, and forming a bonding electrode on an upper surface of said transparent conductive film.

(6) The method for producing a compound semiconductor device according to (5), wherein said current diffusion layer formation step comprises performing coating with said current diffusion layer that is composed of a metal material that does not form a eutectic composition with a group III-V compound semiconductor layer of said second clad layer.

(7) The method for producing a compound semiconductor device according to (5) or (6), wherein said current diffusion layer formation step comprises performing coating with said current diffusion layer such that hollow spaces are left within said depressions.

(8) The method for producing a compound semiconductor device according to (7), wherein said first ohmic electrode formation step comprises forming said first ohmic electrodes on an upper surface of said first clad layer, in positions projected vertically upward from said voids.

Effect of the Invention

As described above, according to the semiconductor light-emitting device of the present invention, because the second ohmic electrodes are positioned within the bottom portions of depressions provided within the bonding surface of the compound semiconductor layer that is bonded to the support plate, the bonding surface becomes flat, meaning the bonding strength between the compound semiconductor layer and the support plate is improved, thus yielding a semiconductor light-emitting device with superior mechanical strength.

Further, because of the existence of the voids derived from the depressions, the surface area of the current diffusion layer that coats the bonding surface and the depressions increases, and because a metal layer with a high reflectance structure is formed at the semiconductor interface, the light extraction efficiency improves, yielding a semiconductor light-emitting device with a high level of brightness.

Moreover, because the first ohmic electrodes and the second ohmic electrodes are arranged in mutually superimposed positions with the compound semiconductor layer disposed therebetween, the light extraction efficiency improves.

Furthermore, according to the method for producing a semiconductor light-emitting device of the present invention, because the bonding surface of the compound semiconductor layer with the support plate is formed flat, the bonding strength between the compound semiconductor layer and the support plate is improved, and the yield also improves.

DESCRIPTION OF THE REFERENCE SYMBOLS 10, 20 Semiconductor light-emitting device
11 Support plate (metal substrate)
12 Sputtered laminated film
12a, 12b Sputtered single layer film
13 Compound semiconductor layer
130 Substrate (semiconductor substrate)
131 First clad layer
131a Upper surface of first clad layer
132 Light-emitting layer
133 Second clad layer
133a Bonding surface of second clad layer
133b Upper surface of second clad layer
14 Current diffusion layer
15 Second ohmic electrode
16 First ohmic electrode
17 Depression
17a Bottom portion of depression
17b Side portion of depression
18 Void
19 Compound semiconductor substrate
21 Transparent conductive film
22 Bonding electrode

BEST MODE FOR CARRYING OUT THE INVENTION

First Embodiment

A detailed description of a first embodiment of the present invention is presented below with reference to the drawings.

Figure 1:
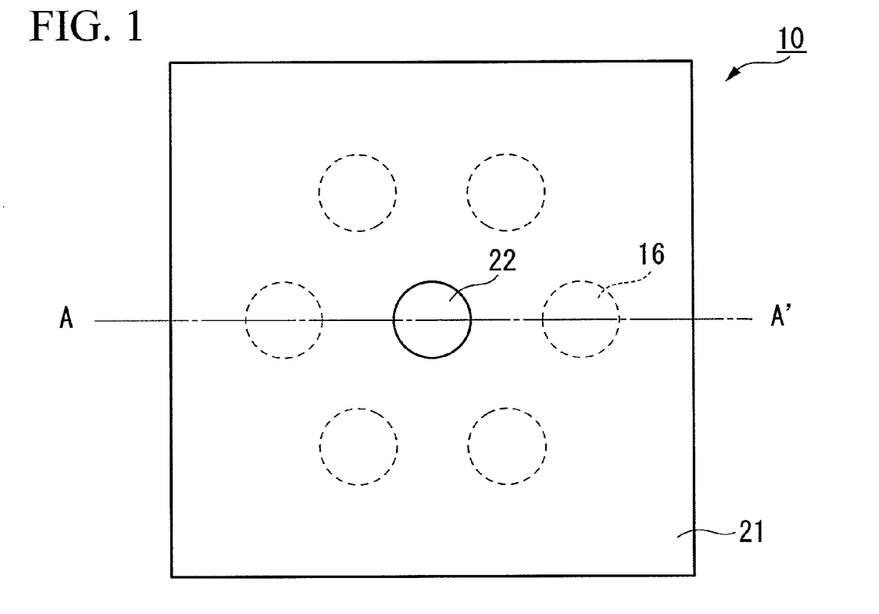
FIG. 1 is a plan view of a semiconductor light-emitting device according to a first embodiment of the present invention.
Figure 2:
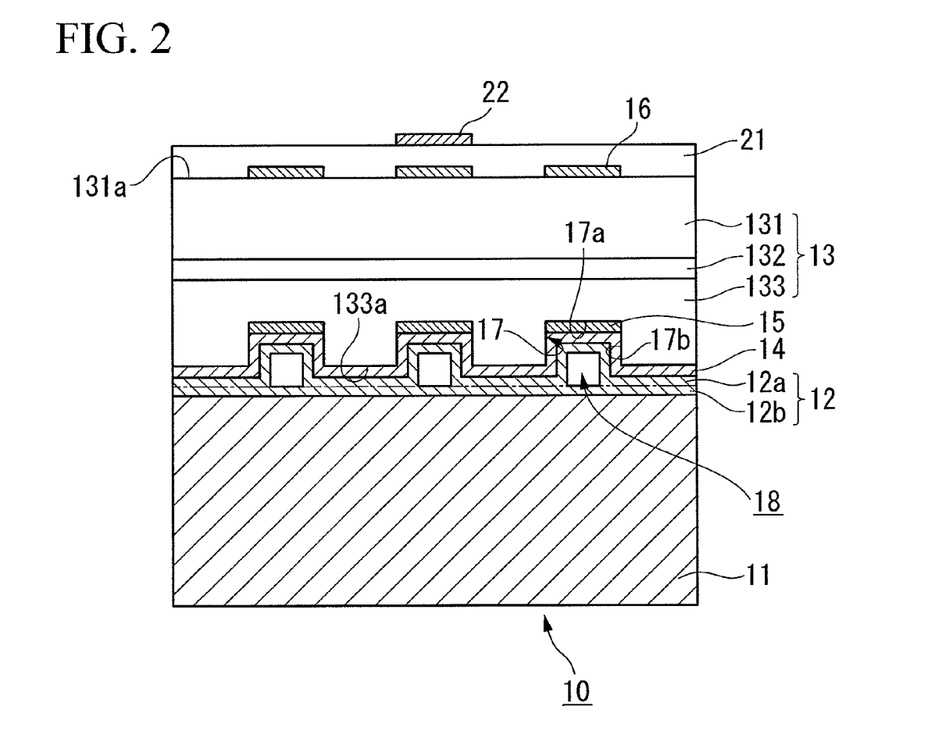
FIG. 2 is a diagram illustrating a cross-section along the line A-A' in FIG. 1.

FIG. 1 and FIG. 2 are diagrams that schematically illustrate the basic structure of a semiconductor light-emitting device according to a first embodiment of the present invention, wherein FIG. 1 is a plan view, and FIG. 2 is a cross-sectional view along the line A-A' shown in FIG. 1.

In the figures mentioned below, the dimensions of each layer and each member in each of the various directions have been altered so that each layer and each member can be illustrated at a size that enables the layer or member to be readily identified within the figure. Further, in the following description, the exemplified materials are merely examples. Accordingly, the present invention is not necessarily limited to the examples listed below, and suitable modifications may be made without departing from the gist of the present invention.

As illustrated in FIG. 1 and FIG. 2, a semiconductor light-emitting device 10 according to the first embodiment of the present invention is composed mainly of a compound semiconductor layer 13 and a metal substrate (support plate) 11 that is bonded to the compound semiconductor layer 13.

The compound semiconductor layer 13 is prepared by laminating at least a first clad layer 131, a light-emitting layer 132, and a second clad layer 133. Second ohmic electrodes 15 and a current diffusion layer 14 that also functions as a reflective layer are formed on a surface 133a of the compound semiconductor layer 13 on the side of the metal substrate 11, and the current diffusion layer 14 and the metal substrate 11 are bonded.

Further, the second ohmic electrodes 15, the current diffusion layer 14 and the metal substrate 11 are conductively connected, with the metal substrate 11 acting as one terminal electrode. On the other hand, first ohmic electrodes 16 are formed on an upper surface 131a of the first clad layer 131, and a transparent conductive film 21 and a bonding electrode 22 are formed on top of the first ohmic electrodes 16. This bonding electrode 22 functions as the other extraction electrode.

As illustrated in FIG. 1, the planar structure of the semiconductor light-emitting device of this embodiment includes the first ohmic electrodes 16 dispersed across the surface of the first clad layer 131 that constitutes part of the semiconductor light-emitting device 10, with the transparent conductive film 21 and the bonding electrode 22 then formed on top.

Further, as illustrated in FIG. 2, the cross-sectional structure of the semiconductor light-emitting device 10 of this embodiment includes the compound semiconductor layer 13 that functions as the light-emitting portion, wherein this compound semiconductor layer 13 contains the first clad layer 131 and the second clad layer 133 positioned on the two opposing surfaces of the light-emitting layer 132.

A plurality of depressions 17 are formed in the bonding surface 133a of the second clad layer 133 that acts as the bonding surface between the compound semiconductor layer 13 and the metal substrate 11, and the second ohmic electrodes 15 are formed within the bottom portions 17a of these depressions 17.

Furthermore, the current diffusion layer 14 is formed so as to coat the bonding surface 133a of the second clad layer 133, the second ohmic electrodes 15 formed within the bottom portions 17a of the depressions 17, and the side portions 17b of the depressions 17. Further, the current diffusion layer 14 and the metal substrate 11 are bonded together via a sputtered laminated film 12 composed of sputtered single layer films 12a and 12b. The current diffusion layer 14 and the metal substrate 11 are not bonded across their entire respective surfaces, and voids 18 derived from the depressions 17 exist at the bonding interface between the sputtered single layer films 12a and 12b.

Moreover, the first ohmic electrodes 16 that function as counter electrodes to the second ohmic electrodes 15 are formed on the upper surface 131a of the first clad layer 131 of the compound semiconductor layer 13. Further, the first ohmic electrodes 16 and the second ohmic electrodes 15 are arranged in mutually superimposed positions with the compound semiconductor layer 13 disposed therebetween.

In the semiconductor light-emitting device 10 of this embodiment, the direction of light extraction is through the upper surface 131a of the first clad layer 131 on which the first ohmic electrodes 16 are provided.

The compound semiconductor layer 13 according to the present embodiment includes at least the first conductive type first clad layer 131 formed from a group III-V compound semiconductor, the light-emitting layer 132 formed from either a first conductive type or an opposite second conductive type group III-V compound semiconductor, and the second conductive type second clad layer 133 formed from a group III-V compound semiconductor laminated together.

In other words, the compound semiconductor layer 13 has a compound semiconductor laminated structure having a pn junction that includes the light-emitting layer 132. The light-emitting layer 132 can also be formed from an n-type or p-type conductive compound semiconductor. This compound semiconductor is preferably represented by a general formula $(Al_XGa_{1-X})_YIn_{1-Y}P$ (wherein $0 \leq X \leq 1$ and $0 < Y \leq 1$). The compound semiconductor layer 13, which functions as the light-emitting portion, may have any one of a double hetero structure, a single quantum well (abbreviation: SQW) structure, or a multiple quantum well (abbreviation: MQW) structure, but in terms of achieving a light emission having superior monochromatic properties, an MQW structure is preferred. The composition of the $(Al_XGa_{1-X})_YIn_{1-Y}P$ (wherein $0 \leq X \leq 1$ and $0 < Y \leq 1$) that constitutes the barrier layer and well layer of the quantum well (abbreviation: QW) structure is determined so that the quantum level that yields the desired emission wavelength is formed within the well layer.

In order to achieve high-intensity light emission, the compound semiconductor layer 13 most preferably has a so-called double hetero (abbreviation: DH) structure composed of the aforementioned light-emitting layer 132, and the clad layers 131 and 133, which are positioned on the two opposing sides of the light-emitting layer 132 and enable the carrier and the light emission that are capable of inducing radiative recombination to be "entrapped" within the light-emitting layer. The clad layers 131 and 133 are preferably formed from a semiconductor material having a wider forbidden band width and a higher refractive index than the compound semiconductor that constitutes the light-emitting layer 132. For example, for a light-emitting layer composed of $(Al_{0.4}Ga_{0.6})_{0.5}In_{0.5}P$ that emits yellow-green light with a wavelength of approximately 570 nm, the clad layers may be composed of $(Al_{0.7}Ga_{0.3})_{0.5}In_{0.5}P$. Intermediate layers may be provided between the light-emitting layer 132 and the clad layers 131 and 133 for the purpose of gradually changing any band discontinuity between the layers. In such cases, the intermediate layer is preferably formed from a semiconductor material having a forbidden band width that is between the forbidden band widths of the light-emitting layer 132 and the clad layers 131 and 133.

The depressions 17 in the present embodiment may have a circular shape, square shape, rectangular shape or wiring-like shape, and there are no particular limitations. Either a single depression 17 or two or more depressions 17 may be provided, and although there are no particular restrictions on the positioning or arrangement of the depressions 17 within the bonding surface 133a of the second clad layer 133 that constitutes part of the compound semiconductor layer 13, in order to provide the ohmic electrodes 15 described below, the depressions 17 are preferably dispersed uniformly across the bonding surface 133a. For example, the depressions 17 may be arranged like uniform stepping stones in a similar manner to the ohmic electrodes 16 illustrated in FIG. 1, or alternatively, electrodes arranged in a non-independent radial pattern, a donut-like pattern, a helical pattern, or in the form of a picture frame, a lattice or branches may be dispersed uniformly across the light-emitting surface.

The expression that the depressions 17 are dispersed across the bonding surface 133a of the second clad layer 133 that constitutes part of the compound semiconductor layer 13 means that the depressions 17 are positioned in such a manner that the ohmic electrodes 15 can be positioned without bias, thus enabling the operating current supplied to the semiconductor light-emitting device via the ohmic electrodes 15 formed within the bottom portions 17a of the depressions 17 to be spread across the entire surface of the device.

In those cases where the depressions 17 are circular in shape, a single dot size preferably has a diameter of 5 to 30 µm, and more preferably 10 to 20 82 m. Further, the surface area proportion occupied by the bottom portions 17a of the depressions 17 to the bonding surface 133a of the second clad layer 133 that constitutes part of the compound semiconductor layer 13 is preferably within a range from 5 to 30% in order to achieve the desired relationship with the surface area of the ohmic electrodes 15 described below.

Although there are no particular restrictions on the depth of the depressions 17, during bonding of the compound semiconductor layer 13 and the metal substrate 11 following formation of the ohmic electrodes 15, the bonding surface 133a of the second clad layer 133 is preferably flat, and therefore the depressions 17 are preferably deeper than the thickness of the second ohmic electrodes 15. The formation of depressions having a height difference within a range from 0.15 to 10 µm is particularly desirable.

The contact resistance between the second ohmic electrodes 15 and the second clad layer 133 differs depending on the combination between the type of metal used for the electrodes and the type of bonded semiconductor crystals, and the surface area of the second ohmic electrodes 15, although the contact resistance between the combined second ohmic electrodes 15 and the second clad layer 133 is preferably not more than approximately 50Ω. If the surface area of the second ohmic electrodes 15 is too small, then the contact resistance increases, and the forward voltage (Vf) of the semiconductor light-emitting device tends to become overly large. Accordingly, the surface area of the combined second ohmic electrodes 15 is preferably at least 5% of the surface area of the light-emitting surface. In contrast, if the surface area of the second ohmic electrodes 15 is too large, then the emitted light from the light-emitting portion is absorbed by the metal layer formed as the second ohmic electrodes 15 and cannot be extracted externally, resulting in a reduction in the emission intensity. Accordingly, the surface area of the second ohmic electrodes 15 is preferably not more than 30% of the surface area of the light-emitting surface.

The material for the second ohmic electrodes 15 can employ conventional materials, and can be formed from an AuZn alloy or AuBe alloy or the like in those cases where the second clad layer 133 of the compound semiconductor layer 13 on which the second ohmic electrodes 15 is formed is a p-type layer, or formed from an AuGeNi alloy or AuSi alloy or the like in those cases where the second clad layer 133 is an n-type layer. The thickness of the second ohmic electrodes 15 is typically within a range from approximately 0.05 to 1.0 μm, and is preferably also less than the depth of the depressions 17.

In this embodiment, in order to supply the input electrical power from an external electrical circuit to the dispersed second ohmic electrodes 15, the second ohmic electrodes 15 are linked together by using the current diffusion layer 14 to coat the surfaces of the second ohmic electrodes 15, the bonding surface 133a of the second clad layer 133, and the entire side portions 17b of the depressions 17.

Examples of metals that can be used for the current diffusion layer 14 include metals having a high electrical conductivity such as gold (Au), silver (Ag), aluminum (Al), nickel (Ni), zinc (Zn), chromium (Cr), platinum (Pt), titanium (Ti), tantalum (Ta), and alloys thereof. Furthermore, of these metals, gold and gold alloys that are resistant to corrosion, and metals that exhibit favorable adhesion to semiconductors, namely metals having high melting points, are preferred, and chromium, platinum and titanium are particularly desirable. By producing a multilayer film that harnesses the advantages of these metals, a particularly stable current diffusion layer 14 can be formed.

Further, in the present embodiment, because the current diffusion layer 14 also performs the function of a reflective layer that reflects light emitted from the light-emitting layer 132, a metal having a high reflectance such as Al, Ag, Au or Pt is particularly desirable.

Moreover, the current diffusion layer 14 is preferably formed from a metal that does not undergo a eutectic reaction with the group III-V compound semiconductor material (for example, $(Al_XGa_{1-X})_YIn_{1-Y}P$, wherein $0 \leq X \leq 1$ and $0 < Y \leq 1$) of the second clad layer 133 on which the current diffusion layer 14 is formed, and among such metals, those that exhibit high electrical conductivity and a high reflectance are ideal. The use of Cr, Pt, Ti or Ta is particularly favorable.

In the present embodiment, the support plate (metal substrate) 11 is used as a support layer for the semiconductor light-emitting device, as a heat-dissipating plate, and as a terminal electrode.

Although there are no particular restrictions on the size of the metal substrate 11, it preferably has a surface area at least as large as the bonding surface 133a of the second clad layer 133, which is the bonding surface for the compound semiconductor layer 13. Further, there are no particular restrictions on the thickness of the metal substrate 11, which may be selected so that the substrate satisfies the required levels of mechanical strength and heat dissipation properties.

Furthermore, there are no particular restrictions on the type of metal used for the metal substrate 11, which may be selected so as to satisfy the required functions of mechanical strength and heat dissipation. For example, examples of metals that may be selected to improve the mechanical strength include SUS, Al and Cu.

The sputtered laminated film 12 is used for bonding the bonding surface 133a of the second clad layer 133 that has been coated with the current diffusion layer 14, and the metal substrate 11.

In this embodiment, because the second ohmic electrodes 15 are formed within the bottom portions 17a of the depressions 17 provided within the bonding surface 133a, the bonding surface 133a that acts as the bonding surface with the metal substrate 11 is flat, making bonding via the sputtered laminated film 12 possible.

When performing bonding via the sputtered laminated film 12, there are no particular restrictions on the combination between the types of metals used for the current diffusion layer 14 that coats the bonding surface 133a, the metal substrate 11, and the sputtered laminated film 12, and any combination may be used, provided it yields favorable adhesive strength at the bonding surface between the sputtering material and the current diffusion layer 14 or the metal substrate 11. Accordingly, either the same metal may be used for all of the above members, or different metals may be used for each member.

When the sputtered single layer film 12a laminated on the current diffusion layer 14 and the sputtered single layer film 12b laminated on the metal substrate 11 are brought into contact, self-diffusion of the metals occurs at the interface between the sputtered single layer films 12a and 12b, thus forming the sputtered laminated film 12. By utilizing this formation of the sputtered laminated film 12, the compound semiconductor layer 13 and the metal substrate 11 can be bonded together without the application of heat or pressure.

In the present embodiment, because the current diffusion layer 14 described above also functions as a reflective layer for the light emitted from the light-emitting layer 132, a metal having a high reflectance such as Al, Ag, Au or Pt is the most preferred.

In the present embodiment, voids 18 are positioned at the bonding interface between the sputtered single layer film 12a laminated on the current diffusion layer 14 and the sputtered single layer film 12b laminated on the metal substrate 11, wherein these sputtered single layer films 12a and 12b constitute the sputtered laminated film 12 that acts as the bonding interface between the current diffusion layer 14 laminated on the compound semiconductor layer 13 and the metal substrate 11. These voids 18 are preferably provided in positions projected vertically down from the first ohmic electrodes.

The shape of the voids 18 approximates the shape of the depressions 17 provided within the second clad layer 133. Further, the depth and volume of the voids 18 are determined by the depth of the depressions 17, and the thicknesses of the second ohmic electrodes 15 and the laminated current diffusion layer 14.

The insides of the voids 18 are preferably either filled with an inert gas or the like, or in a state of vacuum (namely, hollow spaces).

In this embodiment, the first ohmic electrodes 16 are formed on the upper surface 131a of the first clad layer 131 that constitutes part of the compound semiconductor layer 13. The first ohmic electrodes 16 act as one of the electrodes for supplying electrical power from externally, and therefore an area having a contact resistance of not more than approximately 50Ω is preferably provided within a portion of the surface 131a. There are no particular restrictions on the material used for forming the first ohmic electrodes 16, and alloys such as AuGeNi and AuBe may be used.

Further, there are no particular restrictions on the number of the first ohmic electrodes 16, and either a single electrode may be provided as described below in the second embodiment, or a plurality of electrodes may be provided. In the present embodiment, because the first ohmic electrodes 16 are formed on the upper surface 131a of the first clad layer 131 that acts as the light extraction surface, the electrodes are preferably positioned in an islands type arrangement on the upper surface 131a of the first clad layer 131, and the first ohmic electrodes 16 and the second ohmic electrodes 15 are preferably arranged in mutually superimposed positions with the compound semiconductor layer 13 disposed therebetween.

Moreover, the transparent conductive film 21 is formed across the entire surface of the islands type arrangement of the first ohmic electrodes 16 and the upper surface 131*a* of the first clad layer 131, thus generating a transparent conductive film structure. ITO may be used as the material for the transparent conductive film 21, although there are no particular restrictions on the material used.

Further, the bonding electrode 22 is formed on top of the transparent conductive film 21. Au may be used as the material for the bonding electrode 24-22, although there are no particular restrictions on the material used.

As described above, in the semiconductor light-emitting device 10 of the present embodiment, the second ohmic electrodes 15 are positioned within the bottom portions 17*a* of the depressions 17 provided within the bonding surface 133*a* of the compound semiconductor layer 13 that is bonded to the metal substrate 11, and therefore the bonding surface 133*a* is flat, which enables the bonding strength between the compound semiconductor layer 13 and the metal substrate 11 to be improved, and the mechanical strength to also be improved.

Furthermore, by bonding the compound semiconductor layer 13 and the metal substrate 11 using the sputtered laminated film 12, conductive connectivity is maintained between the second ohmic electrodes 15 and the metal substrate 11, which not only improves the light emission efficiency, yielding a higher level of brightness, but also yields excellent heat dissipation properties.

Moreover, be providing the voids 18 derived from the depressions 17, unevenness is formed within the surface of the current diffusion layer 14 that also performs the function of a reflective layer. The existence of this current diffusion layer 14 composed of a metal layer having a high reflectance structure means that light entrapped inside the semiconductor light-emitting device 10 is subjected to diffuse reflection, thereby increasing the external light extraction efficiency for the semiconductor light-emitting device 10, which results in increased brightness.

Further, the voids 18, which are generated by bonding inside a vacuum sputtering apparatus, tend to shrink due to an atmospheric pressure when removed from the sputtering apparatus and returned to an atmospheric pressure environment, and this phenomenon increases the adhesive strength between the compound semiconductor layer 13 and the metal substrate 11.

Furthermore, because the second ohmic electrodes 15 and the first ohmic electrodes 16 are arranged in mutually superimposed positions with the compound semiconductor layer 13 disposed therebetween, the light extraction efficiency improves, thus yielding a semiconductor light-emitting device of superior brightness.

According to the semiconductor light-emitting device 10 of the present embodiment described above, a semiconductor light-emitting device is provided that exhibits superior light extraction efficiency, a high level of brightness, excellent heat dissipation properties, and superior mechanical strength.

Figure 3:
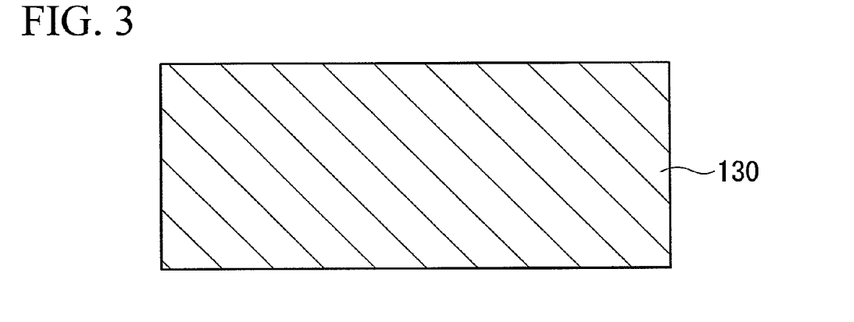
FIG. 3 is a diagram describing a method for producing a semiconductor light-emitting device according to an embodiment of the present invention, and is a schematic cross-sectional view illustrating a compound semiconductor layer formation step.
Figure 4:
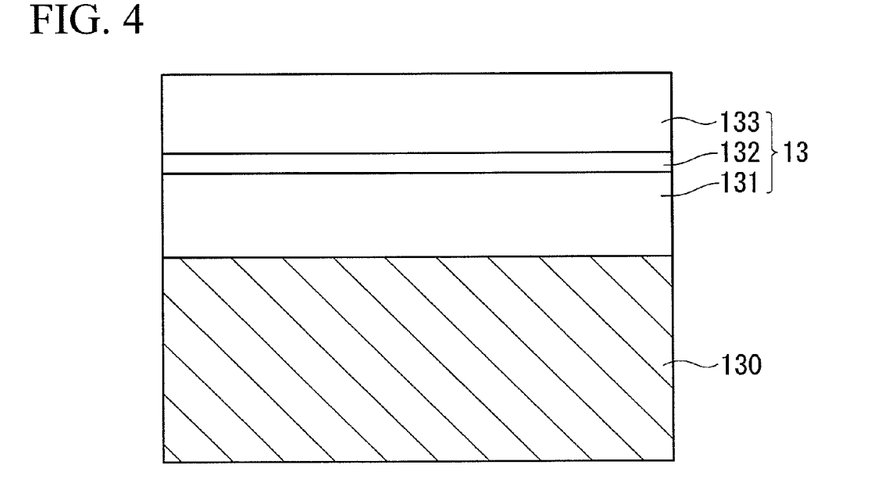
FIG. 4 is a diagram describing a method for producing a semiconductor light-emitting device according to an embodiment of the present invention, and is a schematic cross-sectional view illustrating a compound semiconductor layer formation step.
Figure 5:
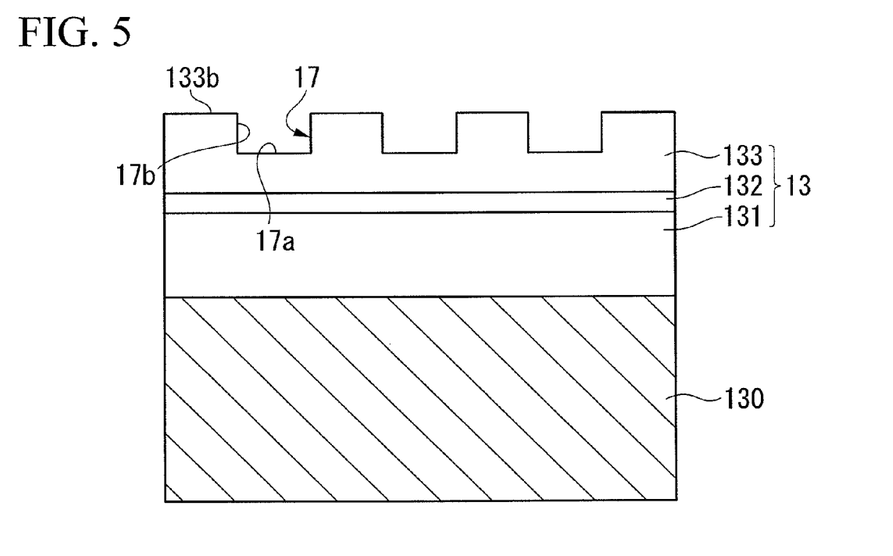
FIG. 5 is a diagram describing a method for producing a semiconductor light-emitting device according to an embodiment of the present invention, and is a schematic cross-sectional view illustrating a depression formation step.
Figure 6:
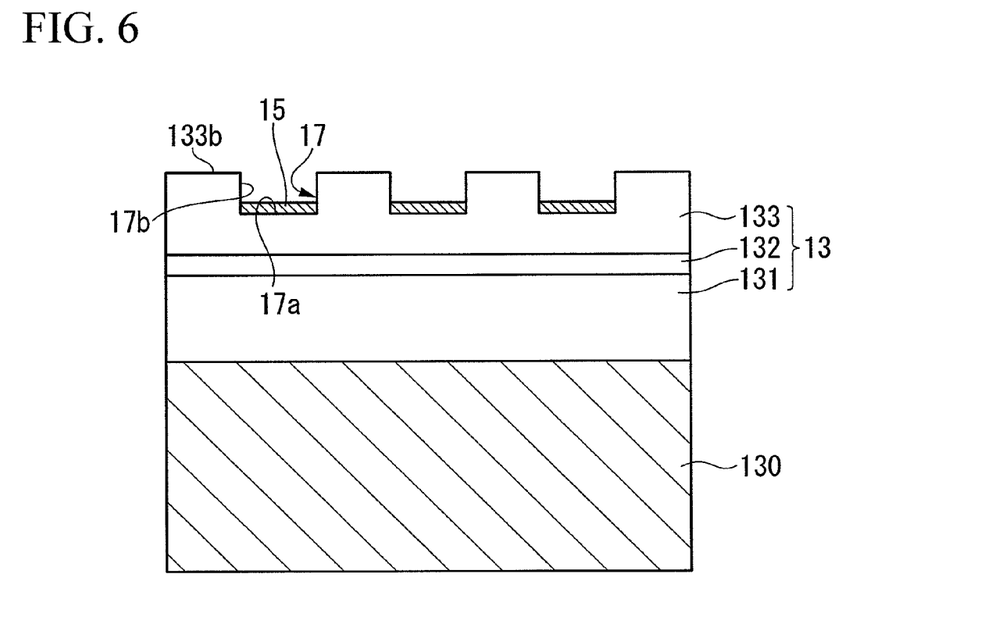
FIG. 6 is a diagram describing a method for producing a semiconductor light-emitting device according to an embodiment of the present invention, and is a schematic cross-sectional view illustrating a second ohmic electrode formation step.
Figure 7:
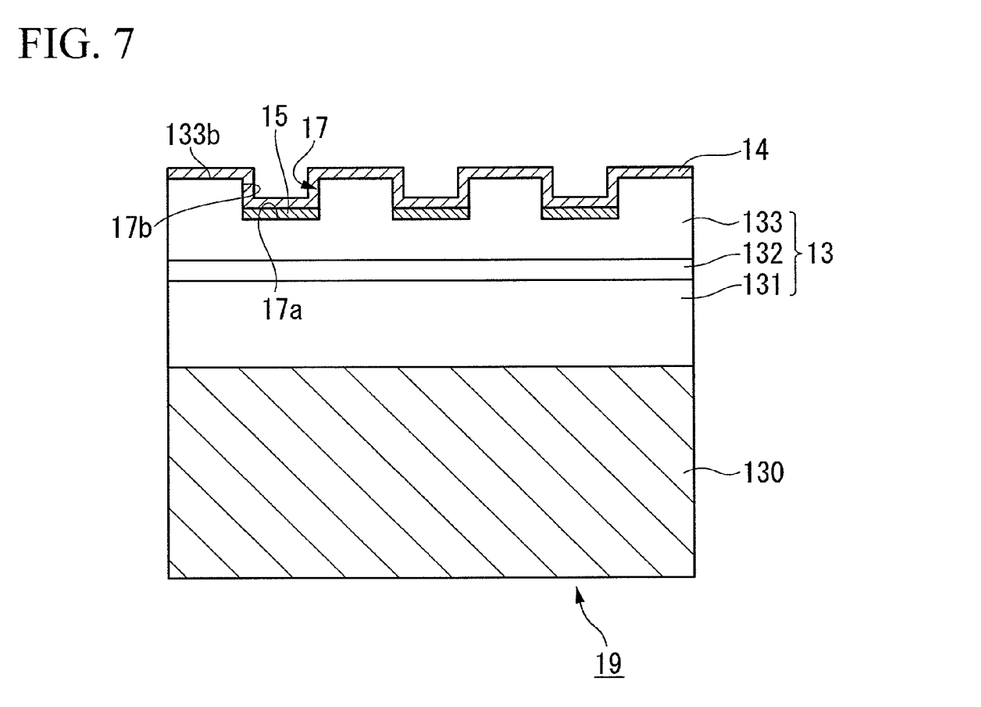
FIG. 7 is a diagram describing a method for producing a semiconductor light-emitting device according to an embodiment of the present invention, and is a schematic cross-sectional view illustrating a current diffusion layer formation step.
Figure 8:
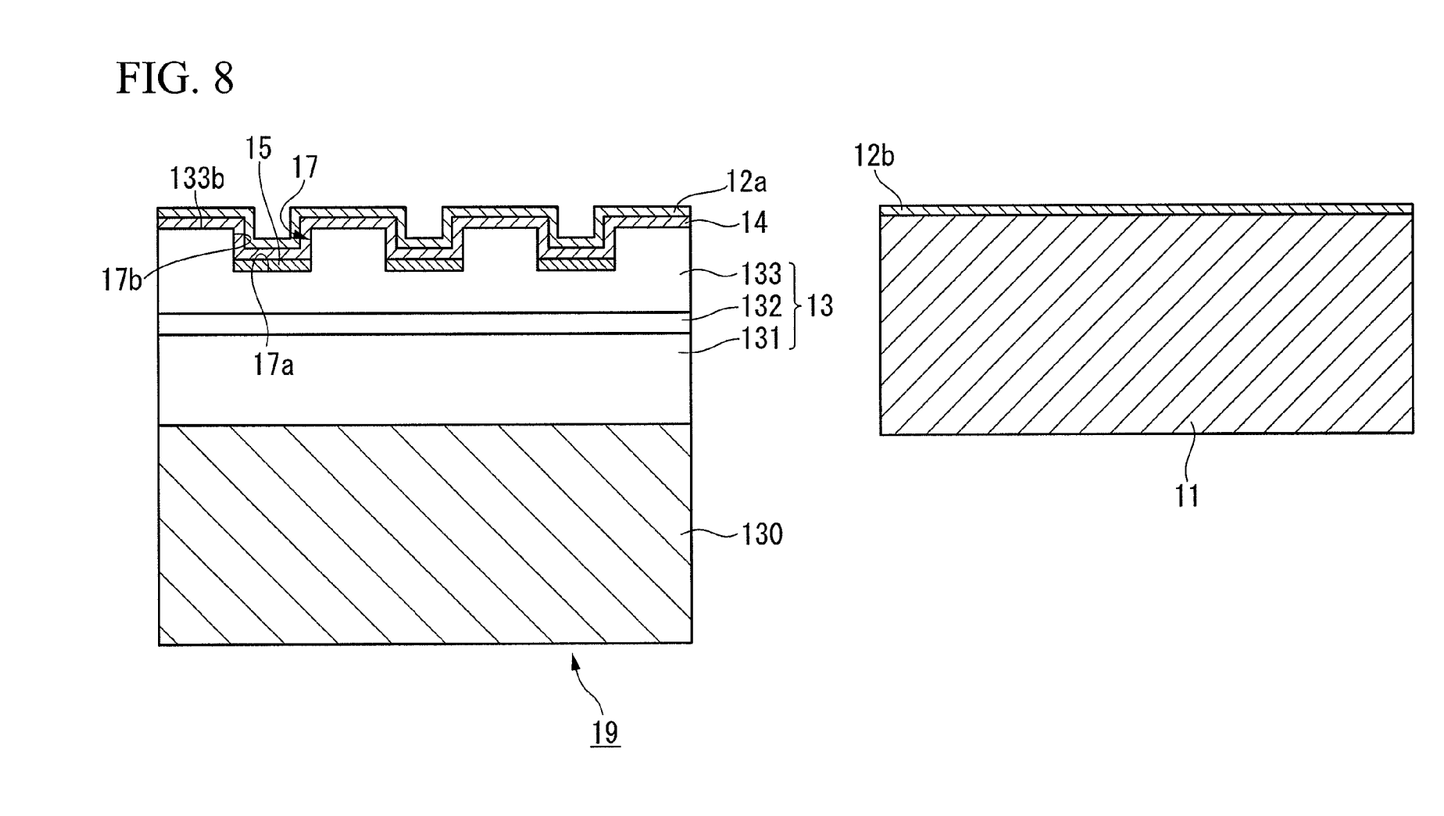
FIG. 8 is a diagram describing a method for producing a semiconductor light-emitting device according to an embodiment of the present invention, and is a schematic cross-sectional view illustrating a metal substrate bonding step.
Figure 9:
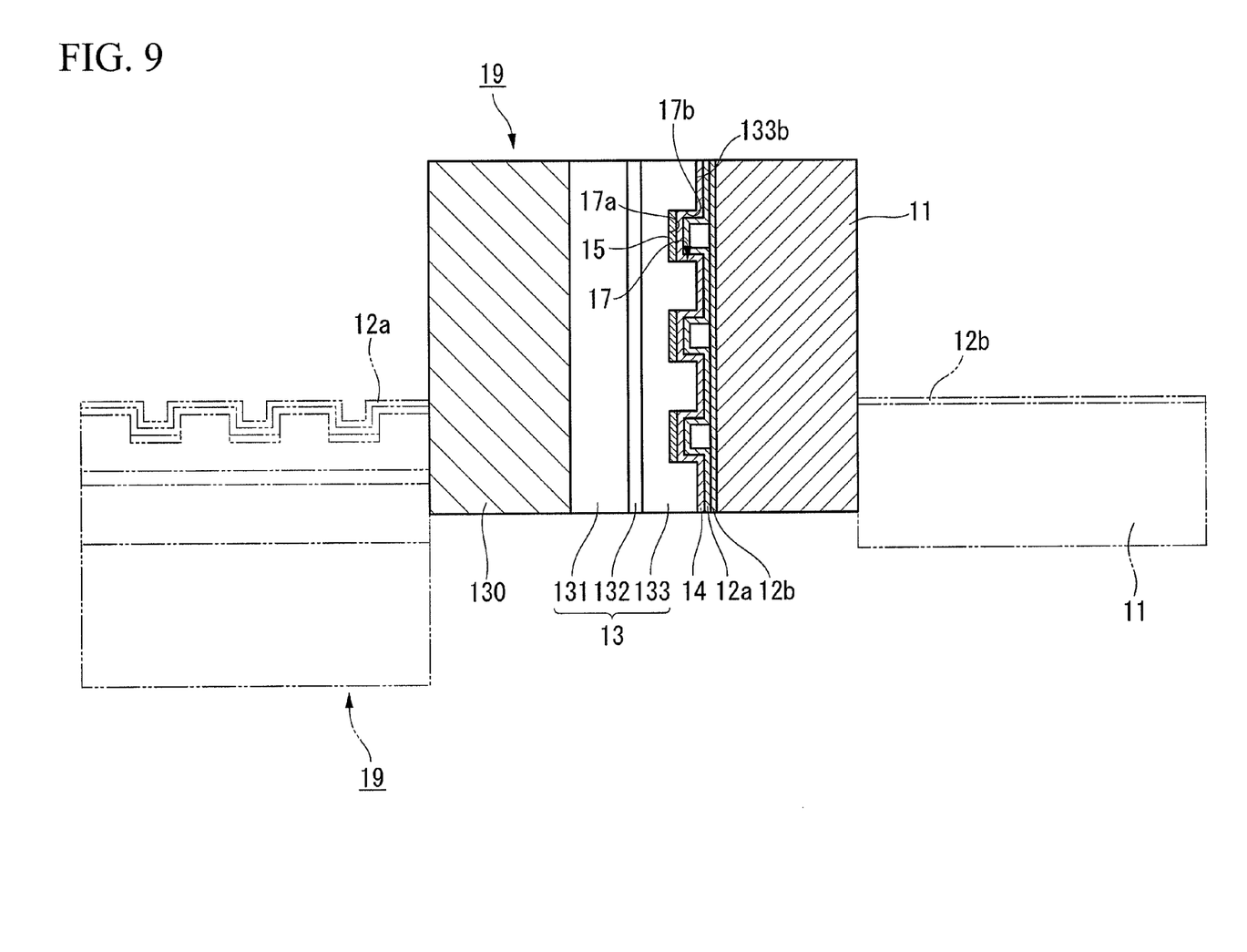
FIG. 9 is a diagram describing a method for producing a semiconductor light-emitting device according to an embodiment of the present invention, and is a schematic cross-sectional view illustrating a metal substrate bonding step.
Figure 10:
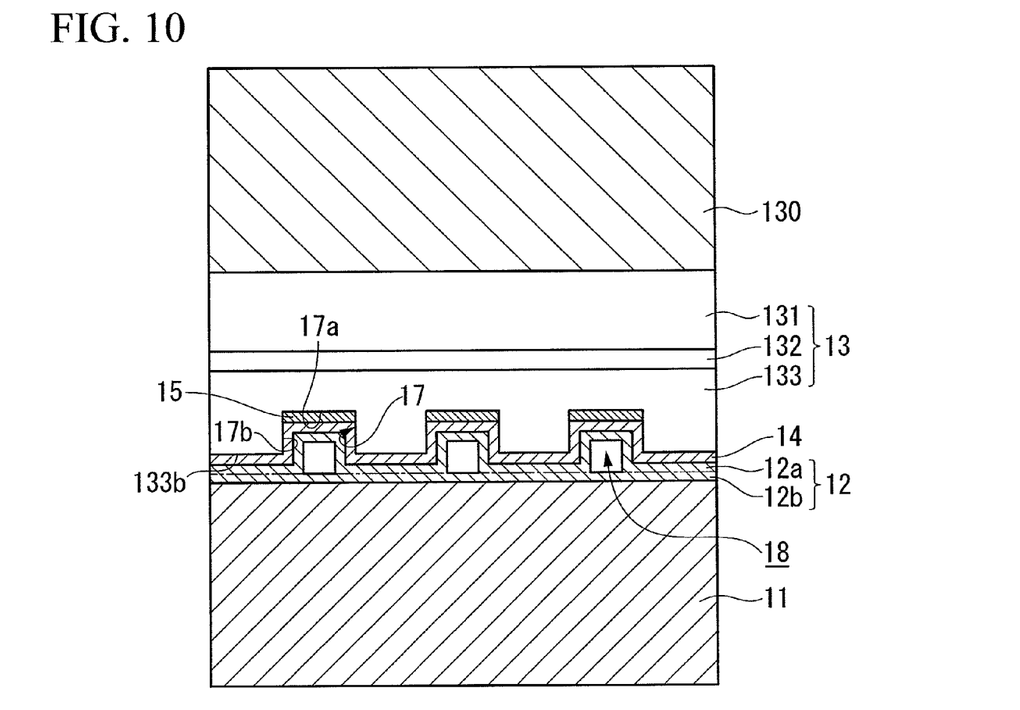
FIG. 10 is a diagram describing a method for producing a semiconductor light-emitting device according to an embodiment of the present invention, and is a schematic cross-sectional view illustrating a metal substrate bonding step.
Figure 11:
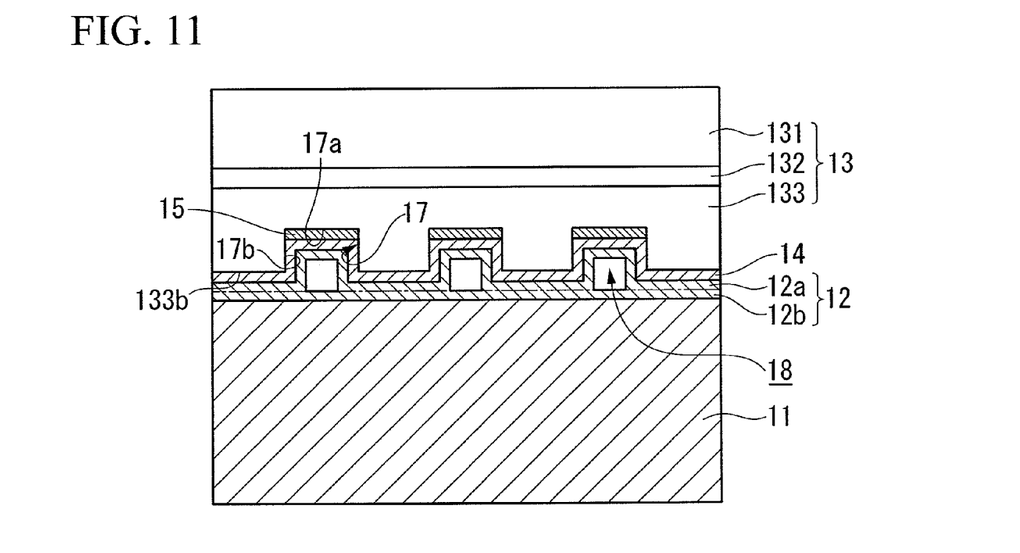
FIG. 11 is a diagram describing a method for producing a semiconductor light-emitting device according to an embodiment of the present invention, and is a schematic cross-sectional view illustrating a semiconductor substrate removal step.
Figure 12:
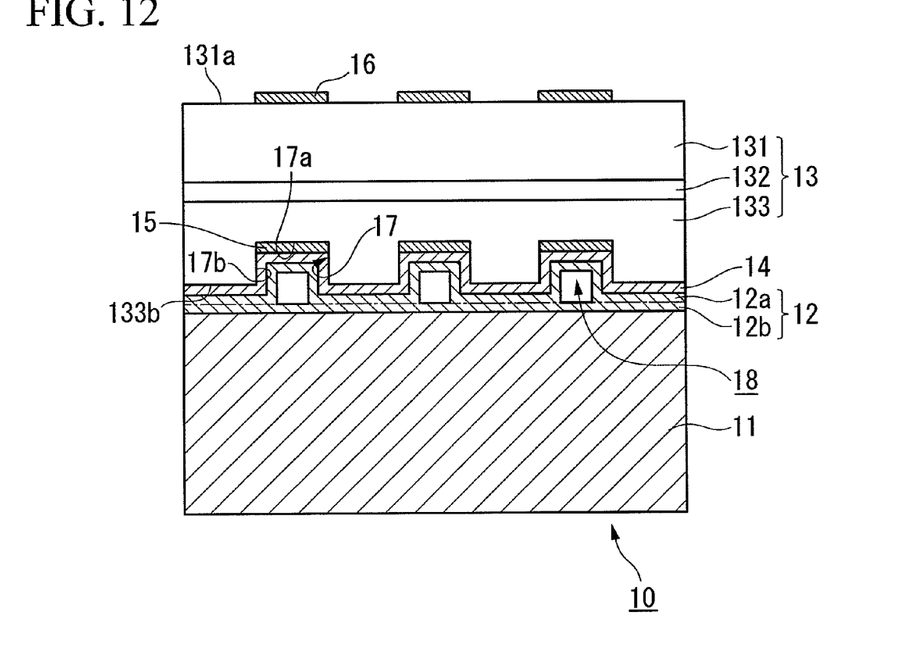
FIG. 12 is a diagram describing a method for producing a semiconductor light-emitting device according to an embodiment of the present invention, and is a schematic cross-sectional view illustrating a first ohmic electrode formation step.
Figure 13:
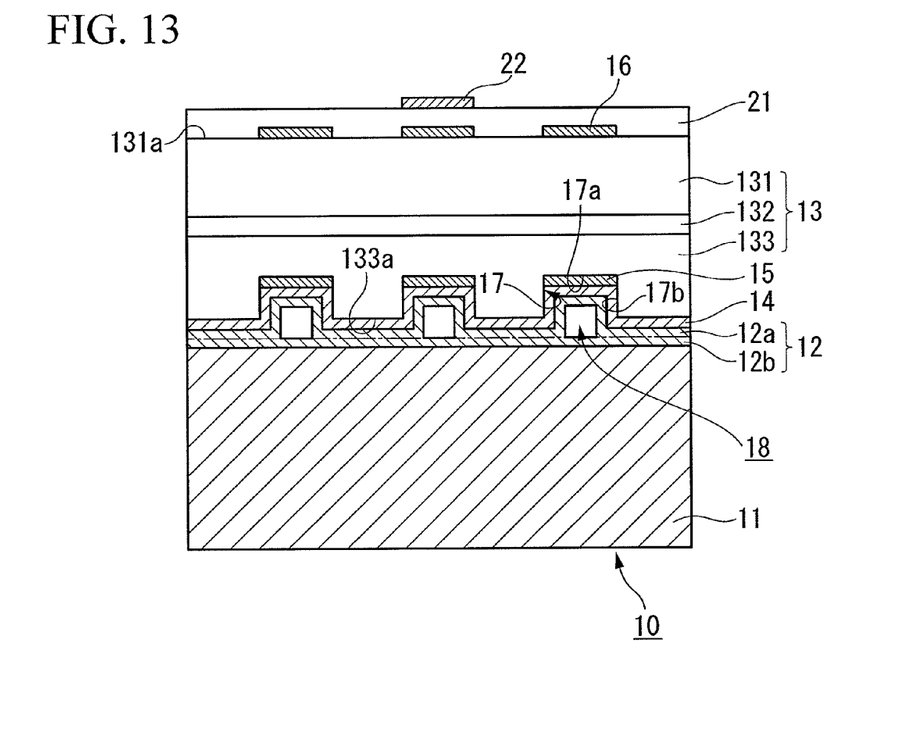
FIG. 13 is a diagram describing a method for producing a semiconductor light-emitting device according to an embodiment of the present invention, and is a schematic cross-sectional view illustrating a bonding electrode formation step.

A method for producing the semiconductor light-emitting device of the first embodiment of the present invention is described below with reference to the drawings. FIG. 3 to FIG. 13 are diagrams describing the method for producing a semiconductor light-emitting device according to this embodiment, wherein FIG. 3 and FIG. 4 are schematic cross-sectional views illustrating a compound semiconductor layer formation step, FIG. 5 is a schematic cross-sectional view illustrating a depression formation step, FIG. 6 is a schematic cross-sectional view illustrating a second ohmic electrode formation step, FIG. 7 is a schematic cross-sectional view illustrating a current diffusion layer formation step, FIG. 8 to FIG. 10 are schematic cross-sectional views illustrating a support plate (metal substrate) bonding step, FIG. 11 is a schematic cross-sectional view illustrating a substrate removal step, FIG. 12 is a schematic cross-sectional view illustrating a first ohmic electrode formation step, and FIG. 13 is a schematic cross-sectional view illustrating a bonding electrode formation step.

FIG. 3 to FIG. 13 are diagrams for describing the method for producing a semiconductor light-emitting device according to the present embodiment, and in a similar manner to that described for FIG. 1 and FIG. 2, the size, thickness and dimensions of each member within the diagrams may differ from the dimensional relationships found in the actual semiconductor light-emitting device.

The method for producing the semiconductor light-emitting device 10 of the present embodiment includes basically a compound semiconductor layer formation step, a depression formation step, a second ohmic electrode formation step, a current diffusion layer formation step, a support plate (metal substrate) bonding step, a substrate removal step, a first ohmic electrode formation step, and a bonding electrode formation step. Each of these steps is described below in sequence.

First, in the compound semiconductor layer formation step, a semiconductor substrate (the substrate) 130 is prepared as illustrated in FIG. 3, and then, as illustrated in FIG. 4, at least the first clad layer 131, the light-emitting layer 132 and the second clad layer 133 are laminated sequentially onto the semiconductor substrate 130 to form the compound semiconductor layer 13.

For example, if an extremely typical GaAs substrate is used as the semiconductor substrate 130, then lattice matching can be readily achieved with an epitaxial layer of AlGaInP, meaning an AlGaInP epitaxial layer of excellent crystallinity can be obtained.

Further, there are no particular restrictions on the method used for forming the compound semiconductor layer 13, and methods that may be used include liquid phase epitaxial growth methods and vapor phase epitaxial growth methods (VPE), although in terms of controlling the film thickness and forming a light-emitting portion having superior light emission efficiency such as a DH structure AlInGaP layer, a MOCVD method is the most desirable.

Next, in the depression formation step, the depressions 17 are formed in an upper surface 133*b* of the second clad layer 133, as illustrated in FIG. 5.

The upper surface 133*b* of the second clad layer 133 corresponds with the bonding surface 133*a* of the second clad layer 133 illustrated in FIG. 2, which represents a cross-sectional view of the semiconductor light-emitting device 10 of the embodiment of the present invention described above.

Although there are no particular restrictions on the method used for forming the depressions 17, in the present embodiment, the depressions 17 are preferably formed using a photolithography process or a laser process, and a photolithography process is particularly desirable as it enables ready control of the shape and size of the depressions 17, and is more likely to yield smooth surfaces for the bottom portions 17*a* and the side portions 17*b* of the depressions 17 following processing.

Subsequently, in the second ohmic electrode formation step, the second ohmic electrodes 15 are formed within the bottom portions 17*a* of the depressions 17, as illustrated in FIG. 6.

Although there are no particular restrictions on the method used for forming the second ohmic electrodes 15, a method in which a metal thin film is formed using a vapor deposition method or sputtering method and subsequently patterned into a predetermined shape is preferred. Following shape processing of the metal thin film, a heat treatment is used to complete the formation of the second ohmic electrodes 15.

Next, in the current diffusion layer formation step, as illustrated in FIG. 7, the current diffusion layer 14 is formed so as to coat the upper surface 133b of the second clad layer 133, the surfaces of the second ohmic electrodes 15, and the side portions 17b of the depressions 17.

Although there are no particular restrictions on the method used for forming the current diffusion layer 14, a metal thin film is preferably formed using a vapor deposition method or sputtering method, and in the production method of the present embodiment, a sputtering method is particularly desirable.

This completes the production of a compound semiconductor substrate 19 having the current diffusion layer 14 formed thereon.

Next, in the support plate (metal substrate) bonding step, as illustrated in FIG. 8, the compound semiconductor substrate 19 and the metal substrate 11 are supported inside a sputtering apparatus, and the sputtered single layer film 12a is formed on the current diffusion layer 14 formed on the compound semiconductor substrate 19, while the sputtered single layer film 12b is formed on the metal substrate 11. The sputtered single layer films 12a and 12b are formed at the same time using the same metal.

Subsequently, as illustrated in FIG. 9, the sputtered single layer film 12a laminated on the compound semiconductor substrate 19 and the sputtered single layer film 12b laminated on the metal substrate 11 are brought into contact inside the sputtering apparatus. Following the sputtered film formation, the sputtered single layer films 12a and 12b are extremely active, and self-diffusion of the metals occurs at the contact interface between the sputtered single layer films. As a result, the sputtered laminated film 12 is formed as illustrated in FIG. 10, thereby bonding the compound semiconductor substrate 19 and the metal substrate 11 together.

There no particular restrictions on the method used for bonding the compound semiconductor substrate 19 and the metal substrate 11, and a bonding method using solder, or a surface-activated bonding method using a neutral argon beam or an argon ion beam may be selected.

Next, in the substrate (semiconductor substrate) removal step, the semiconductor substrate 130 is removed, as illustrated in FIG. 11. Although there are no particular restrictions on the method used for removing the semiconductor substrate 130, removal by etching is preferred.

For example, in those cases where a GaAs substrate is used as the semiconductor substrate 130, because the semiconductor substrate 130 acts as an absorption layer for the light emitted from the light-emitting layer 132, light radiated towards the GaAs substrate side cannot be efficiently extracted externally, and therefore the substrate is preferably removed.

Next, in the first ohmic electrode formation step, the first ohmic electrodes 16 are formed on the upper surface 131a of the first clad layer 131, which has been exposed by the removal of the semiconductor substrate 130, as illustrated in FIG. 12. Although there are no particular restrictions on the method used for forming the first ohmic electrodes 16, a metal film is preferably formed using a vapor deposition method or sputtering method.

Finally, in the bonding electrode formation step, the transparent conductive film 21 is formed over the entire upper surface of the first ohmic electrodes 16 and those portions of the upper surface 131a of the first clad layer 131 where the first ohmic electrodes 16 have not been formed, as illustrated in FIG. 13. Although there are no particular restrictions on the method used for forming the transparent conductive film 21, the film is preferably formed using a vapor deposition method or sputtering method.

Subsequently, the bonding electrode 22 is formed on the upper surface of the transparent conductive film 21. Although there are no particular restrictions on the method used for forming the bonding electrode 22, the electrode is preferably formed using a vapor deposition method or sputtering method.

By following the method described above, a semiconductor light-emitting device 10 such as that illustrated in FIG. 1 and FIG. 2 can be produced.

As mentioned above, in the method for producing the semiconductor light-emitting device 10 according to the present embodiment, because the upper surface 133b of the second clad layer 133 that acts as the bonding surface between the compound semiconductor layer 13 and the metal substrate 11 is flat, the bonding strength between the compound semiconductor layer 13 and the metal substrate 11 is improved, meaning the semiconductor light-emitting device 10 can be produced with favorable yield.

Furthermore, because the upper surface 133b is flat, a bonding method using the sputtered laminated film 12 can be selected as the method for bonding the compound semiconductor layer 13 and the metal substrate 11, and because this bonding method involves no application of heat or pressure, any problems caused by differences in the thermal expansion properties of the compound semiconductor layer 13 and the metal substrate 11 can be suppressed, enabling the semiconductor light-emitting device 10 to be produced with excellent yield.

Second Embodiment

Figure 14:
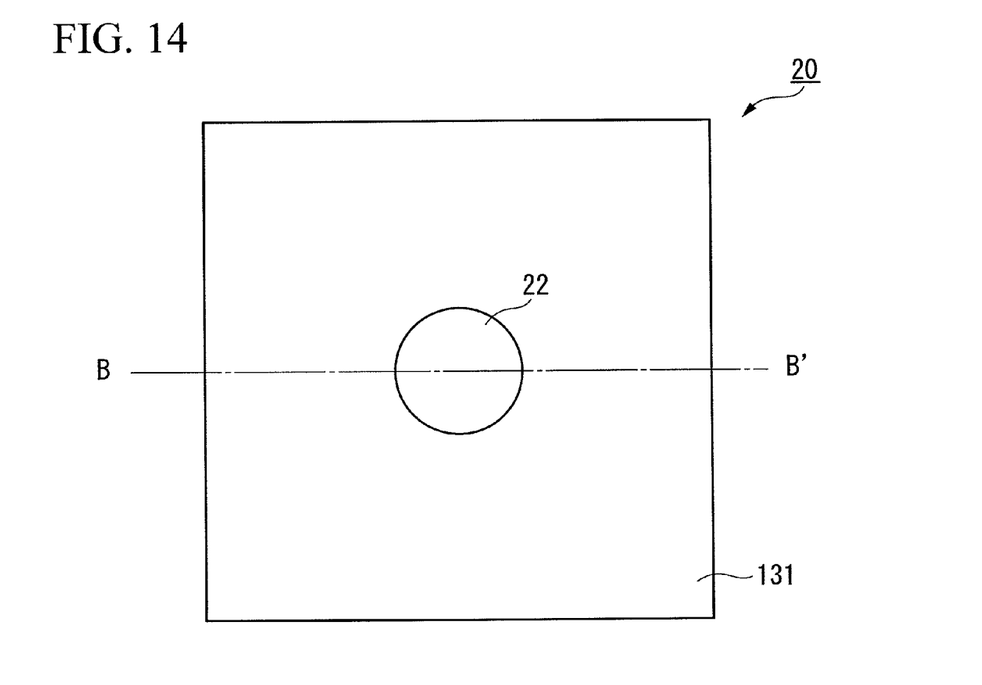
FIG. 14 is a plan view of a semiconductor light-emitting device according to a second embodiment of the present invention.
Figure 15:
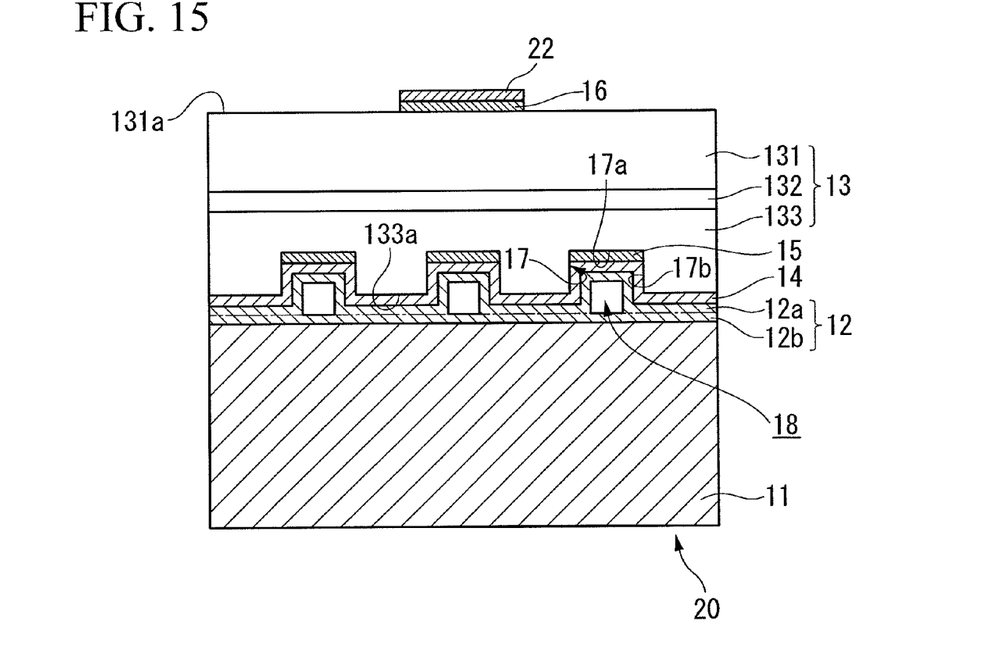
FIG. 15 is a diagram illustrating a cross-section along the line B-B' in FIG. 14.

FIG. 14 and FIG. 15 illustrate a second embodiment of the present invention. FIG. 14 is a plan view of a semiconductor light-emitting device according to this second embodiment of the present invention, and FIG. 15 is a schematic cross-sectional view along the line B-B' shown in FIG. 14.

Comparison of the semiconductor light-emitting device 20 according to this embodiment with the semiconductor light-emitting device 10 according to the first embodiment reveals that the two embodiments differ in terms of the fact that, as illustrated in FIG. 14, only a single first ohmic electrode 16 is formed in the second embodiment, whereas the other structures are identical to those of the first embodiment. Accordingly, those points where the second embodiment differs from the first embodiment are described below, whereas descriptions are omitted for those portions having an identical structure to that of the first embodiment.

As illustrated in FIG. 15, in this second embodiment, only a single first ohmic electrode 16 is formed on the upper surface 131a of the first clad layer 131 that constitutes part of the compound semiconductor layer 13. This first ohmic electrode 16 acts as one of the electrodes for supplying electrical power from externally, and therefore an area having a contact resistance of not more than approximately 50Ω is preferably provided within a portion of the surface 131a. There are no particular restrictions on the material used for forming the first ohmic electrode 16, and AuGeNi or AuBe or the like may be used.

Furthermore, a bonding electrode 22 is formed on top of the first ohmic electrode 16. Au may be used as the material for the bonding electrode 22, although there are no particular restrictions on the material used.

As mentioned above, according to the semiconductor light-emitting device 20 of this embodiment, similar effects to those described for the semiconductor light-emitting device 10 of the first embodiment can be obtained. Moreover, because there is only a single first ohmic electrode 16 that acts as a light absorption layer on the upper surface 131a of the first clad layer 131 which is the light extraction surface, the external light extraction efficiency for the semiconductor light-emitting device 20 can be further improved, resulting in increased brightness.

Next is a description of a method for producing the semiconductor light-emitting device 20 of this second embodiment, although only those steps that differ from the first embodiment are described, with descriptions omitted for those steps that are the same as the first embodiment.

In this embodiment, the method includes the same steps as the first embodiment up to and including the semiconductor substrate removal step. In the first ohmic electrode formation step of the second embodiment, the first ohmic electrode 16 is formed on the upper surface 131a of the first clad layer 131, which has been exposed by the removal of the semiconductor substrate 130. The method used for forming the first ohmic electrode 16 is the same as described for the first embodiment. Subsequently, in the bonding electrode formation step, the bonding electrode 22 is formed on the upper surface of the first ohmic electrode 16, without forming a transparent conductive film. The method used for forming the bonding electrode 22 is the same as described for the first embodiment.

By following the method described above, a semiconductor light-emitting device 20 such as that illustrated in FIG. 14 and FIG. 15 can be produced.

As mentioned above, by using the method for producing a semiconductor light-emitting device 20 according to the present embodiment, similar effects to the first embodiment can be obtained. Further, because a transparent conductive film is not used, the semiconductor light-emitting device 20 can be produced simply at low cost.

The invention claimed is:

1. A semiconductor light-emitting device, comprising:
   a compound semiconductor layer formed by laminating at least a first conductive type first clad layer formed from a group III-V compound semiconductor, a light-emitting layer formed from either a first conductive type or an opposite second conductive type group III-V compound semiconductor, and a second conductive type second clad layer formed from a group III-V compound semiconductor,
   a plurality of first ohmic electrodes formed on said first clad layer,
   a plurality of second ohmic electrodes formed on said second clad layer,
   a transparent conductive film that is foimed on said first clad layer of said compound semiconductor layer and is conductively connected to said first ohmic electrodes,
   a bonding electrode formed on said transparent conductive film, and
   a support plate that is positioned on a side of said second clad layer of said compound semiconductor layer and is conductively connected to said second ohmic electrodes, in which
   said first ohmic electrodes are positioned by being dispersed across a surface of said first clad layer,
   a plurality of depressions are provided within a bonding surface of said second clad layer on a side of said support plate, and said second ohmic electrodes are positioned within bottom portions of said depressions,
   said compound semiconductor layer is provided with a current diffusion layer that coats said bonding surface of said second clad layer, surfaces of said second ohmic electrodes within said depressions, and side portions of said depressions, and
   said support plate is bonded to said current diffusion layer.

2. The semiconductor light-emitting device according to claim 1, wherein a surface of said current diffusion layer that contacts said second clad layer is composed of a metal material that does not form a eutectic composition with said group III-V compound semiconductor material of said second clad layer.

3. The semiconductor light-emitting device according to claim 1, wherein voids derived from said depressions and surrounded by said current diffusion layer and said support plate are hollow spaces.

4. The semiconductor light-emitting device according to claim 3, wherein said voids are provided in positions projected vertically down from said first ohmic electrodes.

5. A method for producing a semiconductor light-emitting device, said method comprising:
   a compound semiconductor layer formation step of sequentially forming at least a first conductive type first clad layer formed from a group III-V compound semiconductor, a light-emitting layer formed from either a first conductive type or an opposite second conductive type group III-V compound semiconductor, and a second conductive type second clad layer formed from a group III-V compound semiconductor on top of a substrate,
   a depression formation step of forming a plurality of depressions in an upper surface of said second clad layer,
   a second ohmic electrode formation step of forming second ohmic electrodes within bottom portions of said depressions,
   a current diffusion layer formation step of forming a current diffusion layer that coats surfaces of said second ohmic electrodes within said depressions, side portions of said depressions, and a surface of said second clad layer in a region outside of said depressions,
   a support plate bonding step of bonding said current diffusion layer to a support plate having a bonding surface for bonding to said current diffusion layer that is coated with an identical material to a material of said current diffusion layer, so that voids are left within said depressions,
   a substrate removal step of removing said substrate,
   a first ohmic electrode formation step of forming first ohmic electrodes in a dispersed arrangement across an upper surface of said first clad layer, and
   a bonding electrode formation step of coating a region surrounding said first ohmic electrodes with a transparent conductive film, and forming a bonding electrode on an upper surface of said transparent conductive film.

6. The method for producing a compound semiconductor device according to claim 5, wherein said current diffusion layer formation step comprises performing coating with said current diffusion layer that is composed of a metal material that does not form a eutectic composition with a group III-V compound semiconductor layer of said second clad layer.

7. The method for producing a compound semiconductor device according to claim 5, wherein said current diffusion layer formation step comprises performing coating with said current diffusion layer such that hollow spaces are left within said depressions.

8. The method for producing a compound semiconductor device according to claim 7, wherein said first ohmic electrode formation step comprises forming said first ohmic electrodes on an upper surface of said first clad layer, in positions projected vertically upward from said voids.

9. The semiconductor light-emitting device according to claim 2, wherein voids derived from said depressions and surrounded by said current diffusion layer and said support plate are hollow spaces.

10. The method for producing a compound semiconductor device according to claim 6, wherein said current diffusion layer formation step comprises performing coating with said current diffusion layer such that hollow spaces are left within said depressions.

* * * * *